(12) United States Patent
Morita

(10) Patent No.: US 10,312,660 B2
(45) Date of Patent: Jun. 4, 2019

(54) LIGHT-EMITTING-ELEMENT MOUNTING PACKAGE

(71) Applicant: NGK SPARK PLUG CO., LTD., Nagoya-shi, Aichi (JP)

(72) Inventor: Masahito Morita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/035,218

(22) Filed: Jul. 13, 2018

(65) Prior Publication Data

US 2019/0027891 A1    Jan. 24, 2019

(30) Foreign Application Priority Data

Jul. 18, 2017  (JP) .................................. 2017-139104

(51) Int. Cl.
*H01S 5/00*    (2006.01)
*H01S 5/022*   (2006.01)
*H01S 5/02*    (2006.01)

(52) U.S. Cl.
CPC .......... *H01S 5/02208* (2013.01); *H01S 5/022* (2013.01); *H01S 5/0206* (2013.01); *H01S 5/02272* (2013.01); *H01S 5/0216* (2013.01); *H01S 5/02244* (2013.01)

(58) Field of Classification Search
CPC ............... H01S 5/02208; H01S 5/0206; H01S 5/02272; H01S 5/022; H01S 5/0216; H01S 5/02244
See application file for complete search history.

(56) References Cited

U.S. PATENT DOCUMENTS

| | | | | |
|---|---|---|---|---|
| 5,557,116 | A | * | 9/1996 | Masui ................. H01S 5/02244 257/100 |
| 6,242,694 | B1 | * | 6/2001 | Muraki ................ H05K 5/0095 174/551 |
| 2003/0178711 | A1 | * | 9/2003 | Honda ..................... H01L 33/62 257/676 |
| 2011/0134948 | A1 | * | 6/2011 | Kawakami ............. B82Y 20/00 372/34 |
| 2016/0120017 | A1 | | 4/2016 | Momoi et al. |
| 2017/0063035 | A1 | * | 3/2017 | Wang .................. H01S 5/18305 |
| 2017/0291397 | A1 | | 10/2017 | Momoi et al. |

FOREIGN PATENT DOCUMENTS

| | | |
|---|---|---|
| JP | 4058172 B2 | 3/2008 |
| JP | 2015-225873 A | 12/2015 |
| JP | 2016-084528 A | 5/2016 |

\* cited by examiner

*Primary Examiner* — Kinam Park
(74) *Attorney, Agent, or Firm* — Stites & Harbison, PLLC; Jeffrey A. Haeberlin; James R. Hayne

(57) ABSTRACT

A light-emitting-element mounting package includes a substrate and a frame that are each made of a metal. The substrate includes a front surface and a back surface that oppose each other, and is provided with a mounting portion for a light emitting element at the front surface. The frame stands on the front surface of the substrate and includes an inner side surface that surrounds the mounting portion and an outer side surface. A substrate-side end portion of the frame includes a curved inclined surface (inclined portion) in a region near the outer side surface. The curved inclined surface is inclined toward a center of the frame in a thickness direction. A silver solder (joining material) is provided between the front surface of the substrate and the frame.

5 Claims, 7 Drawing Sheets

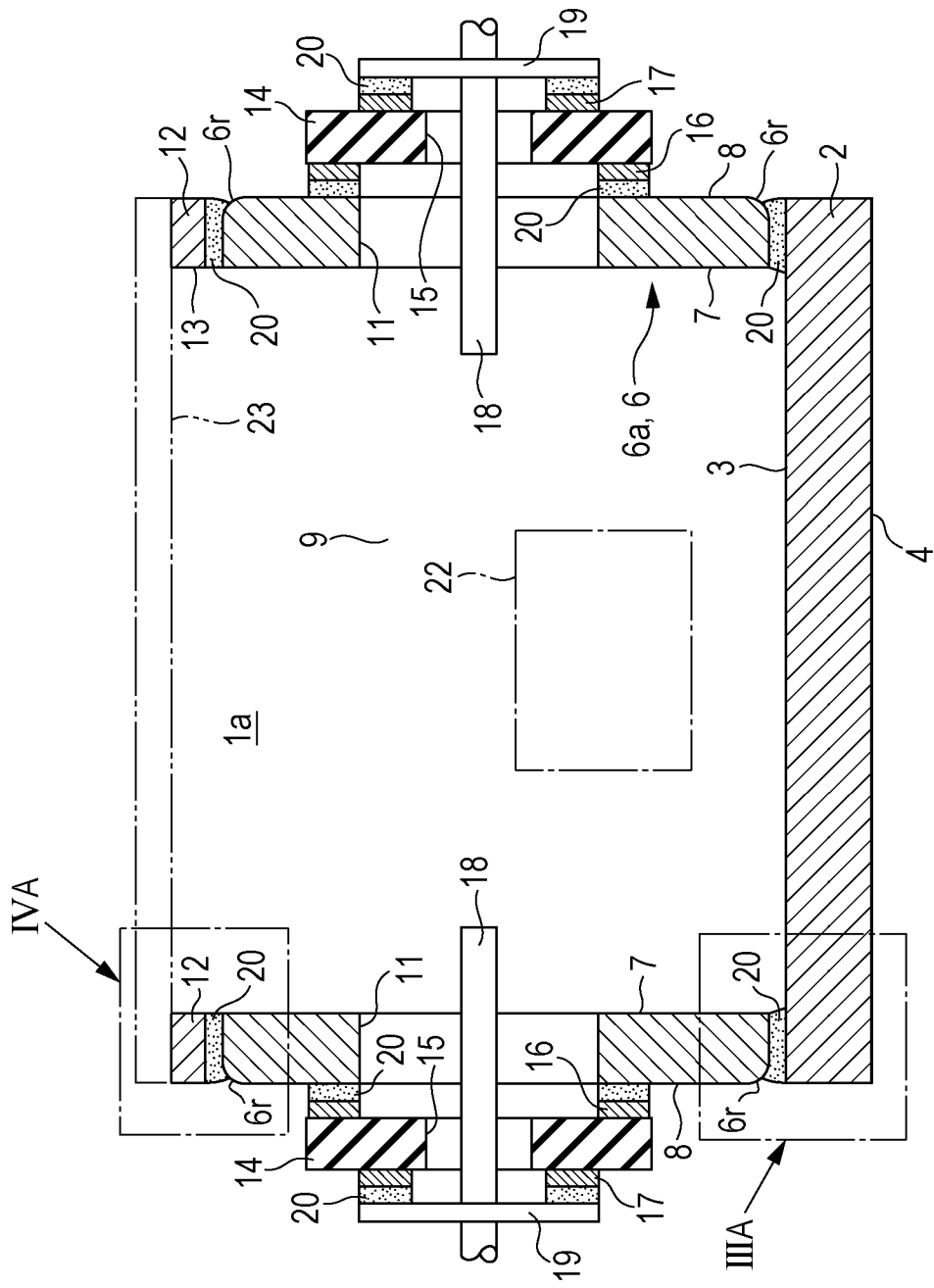

FIG. 5A
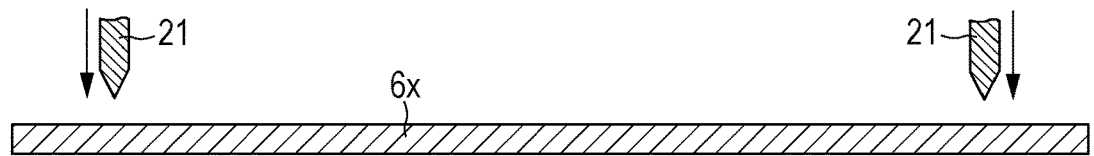
FIG. 5B
FIG. 5C
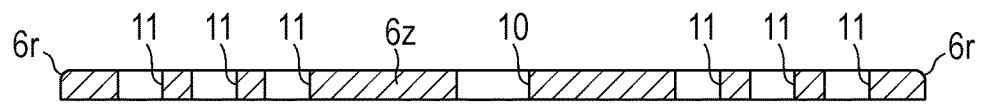
FIG. 5D       FIG. 5E       FIG. 5F
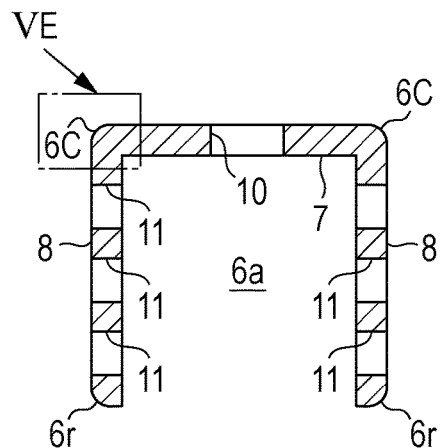 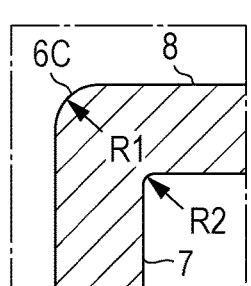 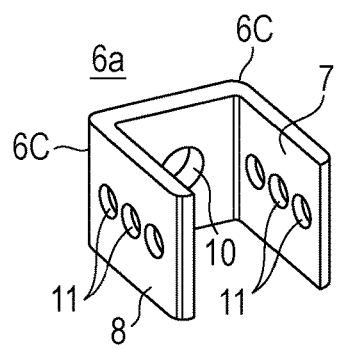

LIGHT-EMITTING-ELEMENT MOUNTING PACKAGE

CROSS REFERENCE TO RELATED APPLICATION

The preset application claims priority to Japanese Patent Application No. 2017-139104, which was filed on Jul. 18, 2017, the disclosure of which is herein incorporated by reference in its entirety.

BACKGROUND OF THE INVENTION

Field of the Invention

The present invention relates to a light-emitting-element mounting package for mounting a light emitting element, such as a laser diode.

Description of the Related Art

PTL 1, for example, proposes a package for housing a semiconductor device including a flat metal substrate having a mounting region for a semiconductor device on a top surface thereof; a rectangular frame that is brazed to the top surface of the metal substrate and surrounds the mounting region; and a plurality of lead members that extend through the frame and include flange portions that are in contact with an outer side surface of the frame. The flange portions of the lead members protrude outward from the frame beyond a side surface of the metal substrate in plan view.

The rectangular frame includes a metal member that is angular U-shaped in plan view and a flat-plate-shaped ceramic insulating member that is brazed to the metal member so as to cover an opening in the metal member and through which the lead members horizontally extend.

In the above-described package for housing the semiconductor device, the frame is formed by brazing the metal member and the insulating member together, and is brazed to the top surface of the metal substrate. Accordingly, the areas of joining surfaces between the components are limited. Therefore, there is a risk that the package cannot be sufficiently airtightly sealed from the outside due to an insufficient amount of solder supplied to each joining surface. If the amount of solder is very small, there is a risk that a leak will occur between the inside and outside of the package.

RELATED ART DOCUMENT

PTL 1 is Japanese Unexamined Patent Application Publication No. 2015-225873 (pages 1 to 11, FIGS. 1 to 8).

BRIEF SUMMARY OF THE INVENTION

An object of the present invention is to solve the problem discussed above in the description of the related art section and provide a light-emitting-element mounting package that can be reliably maintained airtight.

The present invention has been made to solve the above-described problem based on the idea of forming a package including a substrate made of a metal and a frame made of a metal that stands on the front surface and forming, for example, an inclined portion on a substrate-side end portion of the frame, the inclined portion being inclined toward a center of the frame in the thickness direction.

A light-emitting-element mounting package according to the present invention includes a substrate and a frame. The substrate is made of a metal. The substrate includes a front surface and a back surface that oppose each other (i.e., the back surface opposes the front surface). The substrate is provided with a mounting portion for a light emitting element at the front surface side. The frame is also made of a metal. The frame stands on the front surface of the substrate and includes an inner side surface that surrounds the mounting portion and an outer side surface. A substrate-side end portion of the frame includes (i.e., defines) an inclined portion or a step portion in at least one of a region near the outer side surface and a region near the inner side surface. The inclined portion is inclined toward a center of the frame in a thickness direction. The step portion has a thickness less than a thickness of a central portion of the frame in a vertical direction. A joining material joins the substrate and the frame together. The joining material is disposed between the front surface of the substrate and a part of the substrate-side end portion of the frame that opposes the front surface of the substrate.

The above-described light-emitting-element mounting package has the following effect (1).

(1) The inclined portion, which is inclined toward the center of the frame in the thickness direction, or the step portion, whose thickness is less than the thickness of the central portion of the frame in the vertical direction, is formed on the substrate-side end portion of the frame in at least one of the region near the outer side surface and the region near the inner side surface. In addition, the substrate and the frame are joined together by the joining material disposed between the front surface of the substrate and the part of the substrate-side end portion of the frame that opposes the front surface of the substrate. As a result, the joining material is applied also to the inclined portion or the step portion in the joining section between the substrata and the frame, so that a larger amount of joining material can be applied over a larger area. Therefore, the package including the joining section can be easily airtightly sealed.

The substrate, the frame, which may be composed of a plurality of metal members, and the metal ring are made of, for example, Kovar (Fe, 29% Ni, 17% Co), alloy 42 (Fe, 42% Ni), or alloy 194 (Cu, 2.3% Fe, 0.03% P).

The frame may be have a rectangular frame shape in plan view, or be cylindrical. When the frame is cylindrical, the front surface of the substrate has a circular shape similar to the shape of the frame. The frame may be formed by joining a plurality of metal members together or by bending a single metal base material and joining a pair of opposing joining end surfaces together by using a joining material.

The inclined portion may include a flat inclined surface or a curved inclined surface. The curved inclined surface may be formed by performing a punching or cutting (shearing) process on a flat metal base plate. In this case, the curved inclined surface is formed along a surface of the metal base plate at the side from which a punch or a cutter is inserted. The flat inclined surface or the step portion may be formed by, for example, cutting or grinding.

Silver solder (Ag—Cu based alloy), for example, may be used as the joining material.

The substrate has a plurality of through holes that extend therethrough between the front surface and the back surface, and lead pins that are electrically insulted from the substrate extend through the respective through holes. Alternatively, a pair of side walls of the frame that face each other have through holes that individually extend therethrough, and lead plates that are electrically insulated from the frame extend through the respective through holes.

The mounting portion for the light emitting element is included in the front surface of the substrate, or is included in a top surface of a radiator that extends through a through hole formed so as to extend through the substrate between the front surface and the back surface. The radiator is made of copper, silver, or an aluminum alloy having a thermal conductivity higher than those of the substrate and the frame.

The light emitting element is, for example, a laser diode (LD) or a light emitting diode (LED).

The present invention includes the light-emitting-element mounting package wherein a metal ring is disposed on an opposite end portion of the frame at an end opposite to the substrate-side end portion, the metal ring extending along an outline of the frame in plan view, therein the inclined portion or the step portion is additionally formed on the opposite end portion in at least one of a region near the outer side surface and a region near the inner side surface, and wherein a joining material that joins the frame and the metal ring together is disposed between the frame and the metal ring. In other words, the frame includes an opposite end portion opposite to the substrate-side end portion, and a metal ring is disposed on the opposite end portion of the frame extending along an outline of the frame in plan view. The opposite end portion defines an inclined portion or a step portion in at least one of a region near the outer side surface and a region near the inner side surface. A joining material is disposed between the frame and the metal ring such that the joining material joins the frame and the metal ring together.

In this case, the following effect (2) can be obtained in addition to the above-described effect (1).

(2) The inclined portion or the step portion is additionally formed on the opposite end portion of the frame at the end opposite to the substrate-side end portion in at least one of the region near the outer side surface and the region near the inner side surface. Therefore, also in the joining section between the frame and the metal ring, the joining material is applied also to the inclined portion or the step portion, so that a larger amount of joining material can be applied over a larger area. As a result, the package including the joining section can be more easily airtightly sealed.

The present invention includes the light-emitting-element mounting package wherein the frame includes at least one joining end portion in plan view, and the inclined portion or the step portion is formed on the joining end portion in at least one of a region near the outer side surface and a region near the inner side surface. In other words, in plan view, the frame includes at least one joining end portion, and the at least one joining end portion defines an inclined portion or a step portion in at least one of a region near the outer side surface and a region near the inner side surface.

In this case, the following effect (3) can be obtained in addition to the above-described effects.

(3) When the frame is composed of one or more metal members, the inclined portion or the step portion is formed on at least one joining end portion in at least one of the region near the outer side surface and the region near one inner side surface. Accordingly, in the joining section including the inclined portion or the step portion, the joining material is applied also to the inclined portion or the step portion, so that a larger amount of joining material can be applied over a larger area. As a result, the package including the joining section of the frame can be airtightly sealed.

The present invention includes the light-emitting-element mounting package wherein the frame includes at least one bent portion in plan view, and a radius of curvature of a curved part of the outer side surface of the bent portion is greater than a radius of curvature of a curved part of the inner side surface of the bent portion. In other words, in plan view, the frame includes at least one bent portion having an outer side surface and an inner side surface. A radius of curvature of a curved part of the outer side surface of the bent portion is greater than a radius of curvature of a curved part of the inner side surface of the bent portion.

In this case, at least one metal member that constitutes the frame includes at least one bent portion formed by a bending process in plan view, and the radius of curvature of the curved part of the outer side surface of the bent portion is greater than the radius of curvature of the curved part of the inner side surface of the bent portion. Therefore, the stress applied to the bent portion can be dissipated at the radius of curvature of the curved part of the outer side surface of the bent portion. In addition, when the frame is joined to the substrate and to the metal ring in the above-described joining sections, the joining performance can be improved since the stress applied to the above-described bent portion can be dissipated at the radius of curvature of the curved part of the outer side surface of the bent portion. As a result, the above-described effects (1) and (2) can be enhanced.

The present invention includes the light-emitting-element mounting package wherein the substrate and the metal ring each have a rectangular outline having four corner portions in plan view, wherein the frame stands on the substrate so as to extend along the outline of the substrate, and wherein the bent portion of the frame is disposed at each corner portion of at least one of the substrate and the metal ring, the corner portion including a protruding portion that protrudes outward beyond the curved part of the outer side surface of the bent portion of the frame. In other words, in plan view, the substrate has a rectangular outline having four corner portions and the metal ring has a rectangular outline having four corner portions; and the frame stands on the substrate so as to extend along the outline of the substrate. The frame includes bent portions disposed at each of the four corner portion of at least one of the substrate and the metal ring. Each of the four corner portions includes a protruding portion that protrudes outward beyond the respective curved part of the outer side surface of the bent portion of the frame.

In this case, the protruding portion that protrudes outward from the curved part of the outer side surface of the bent portion of the frame is provided on each corner portion of at least one of the substrate and the metal ring. Since the protruding portion is disposed near the joining section in which the frame is joined to the substrate or the metal ring on the corner portion, when the joining material is applied to the joining section near the corner portion, excess joining material can to spread over a large area (hereinafter referred to as effect (4)).

BRIEF DESCRIPTION OF THE DRAWINGS

Illustrative aspects of the invention will be described in detail with reference to the following figures wherein:

FIG. 2 is a vertical sectional view of a light emitting device including the package taken along line II-II in FIG. 1A;

Figure 4A:
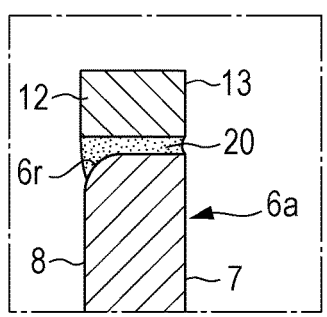
Figure 4B:
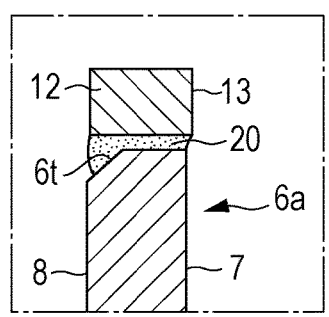
Figure 4C:
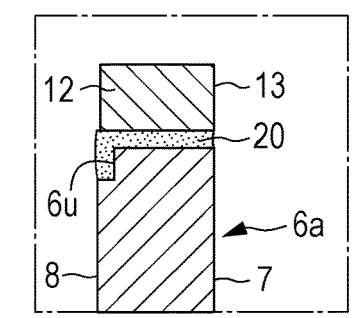
Figure 6A:
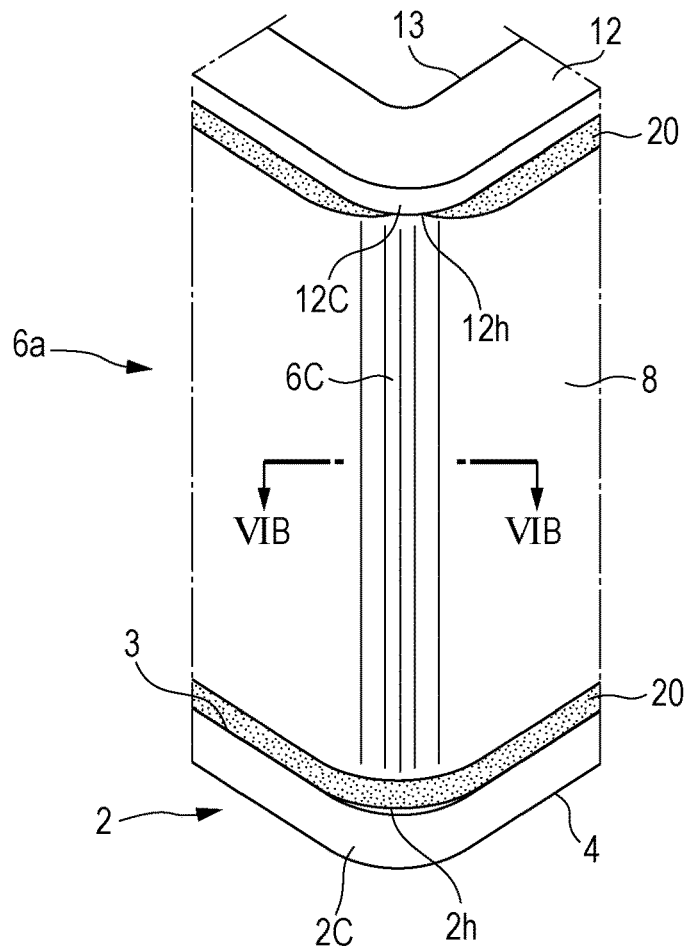
Figure 6B:
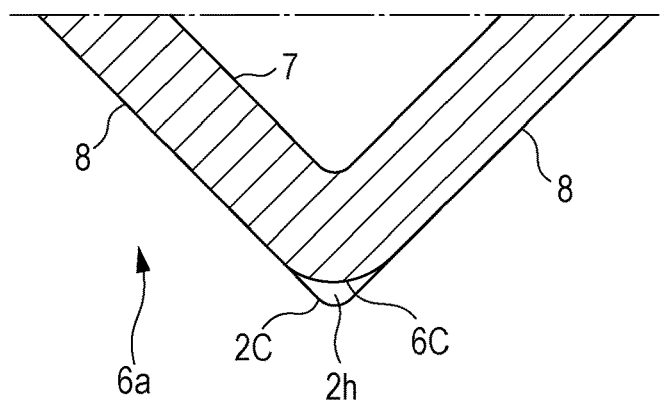
Figure 7:
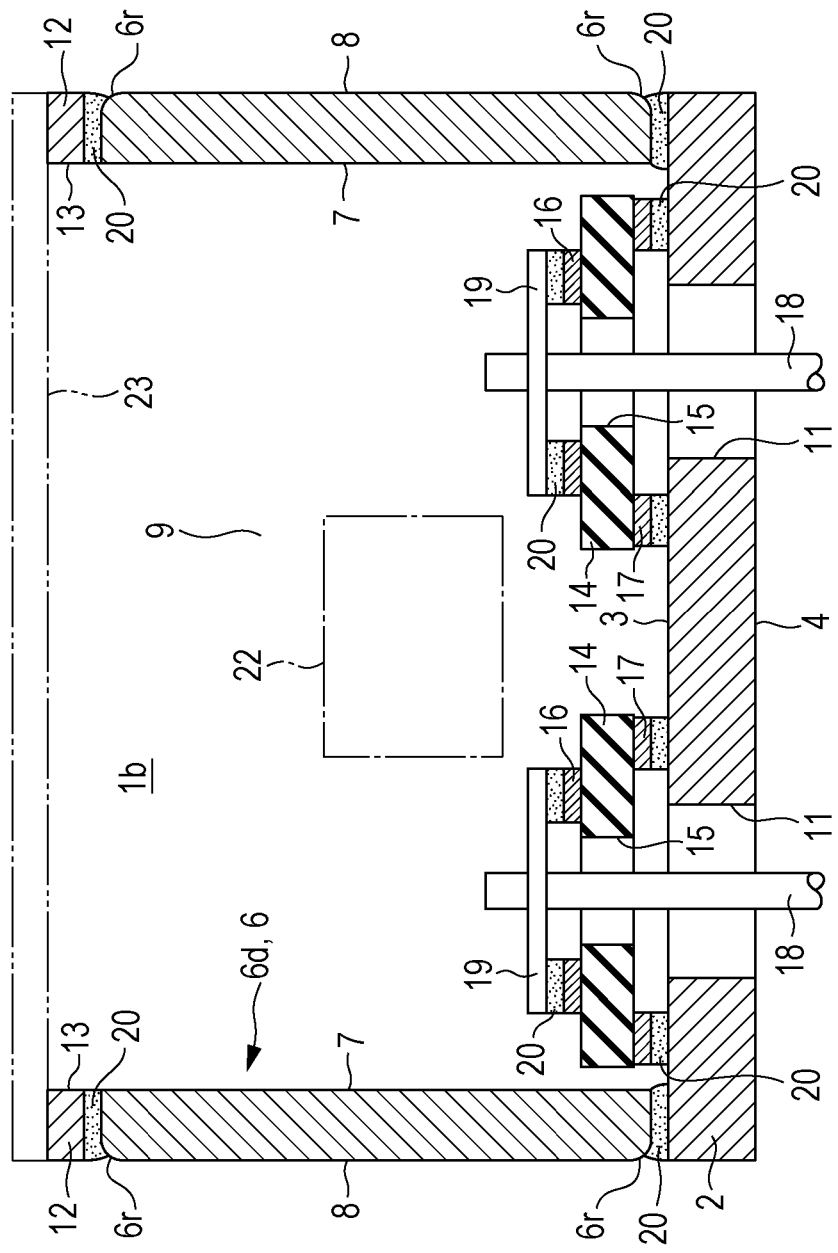
Figure 8A:
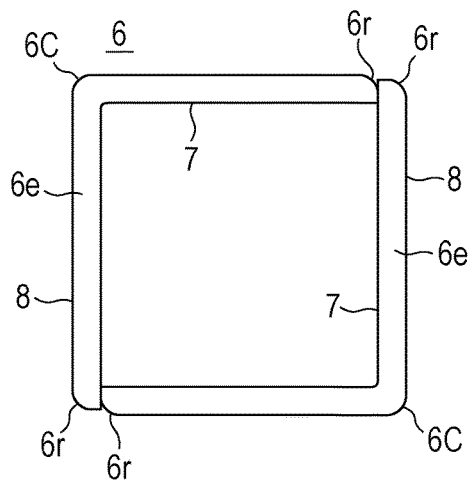
Figure 8B:
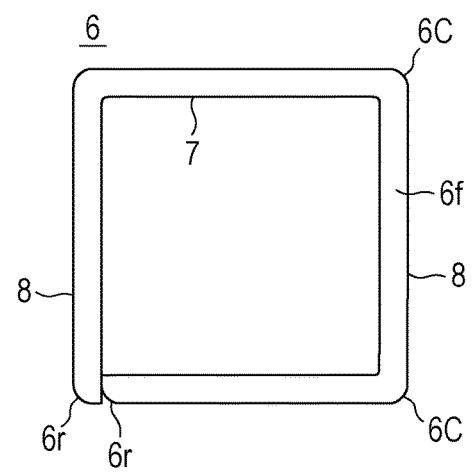
Figure 9A:
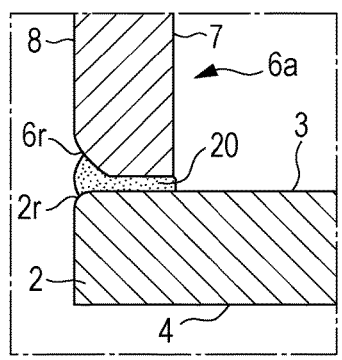
Figure 9B:
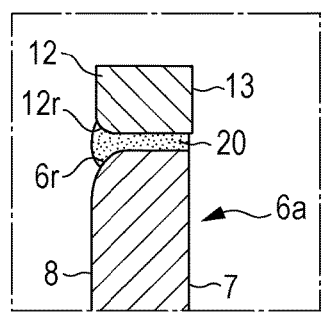
Figure 9C:
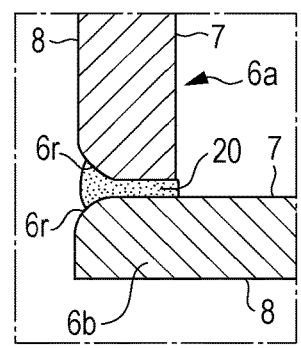

3B and 3C are enlarged sectional views of joining portions according to other embodiments in the same part;

FIG. 4A is an enlarged sectional view of part IVA surrounded by the one-dot chain line in FIG. 2, and FIGS. 4B and 4C are enlarged sectional views of joining portions according to other embodiments in the same part;

FIGS. 5A to 5D are schematic diagrams illustrating the steps for manufacturing a metal member of a frame included in the package, FIG. 5E is an enlarged view of part VE surrounded by the one-dot chain line in FIG. 5D, and FIG. 5F is a perspective view of the metal member;

FIG. 6A is a perspective view illustrating a bent portion of the frame included in the package, and FIG. 6B is a horizontal sectional view taken along line VIB-VIB in FIG. 6A;

FIG. 7 is a vertical sectional view similar to FIG. 2, illustrating a light emitting device including a package according to another embodiment;

FIGS. 8A and 8B are schematic diagrams illustrating frames having different structures; and FIGS. 9A to 9C are vertical sectional views illustrating joining portions according to application embodiments.

DETAILED DESCRIPTION OF EXEMPLARY EMBODIMENTS OF THE INVENTION

Embodiments of the present invention will now be described.

Figure 1A:
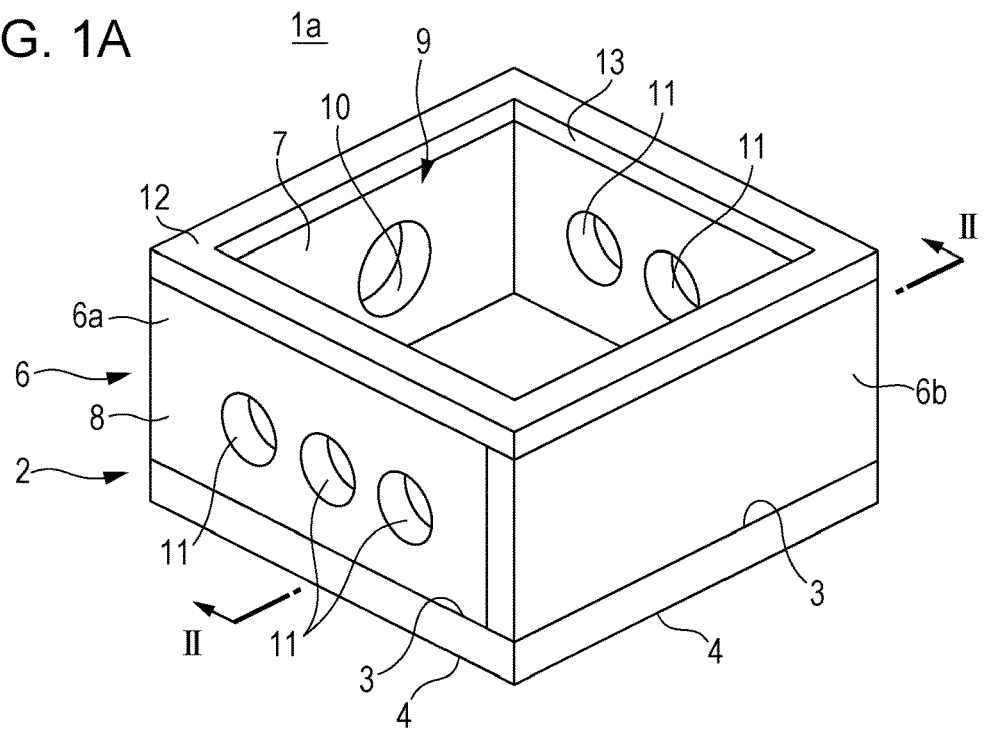
FIG. 1A is a perspective view of a package according to an embodiment of the present invention.
Figure 1B:
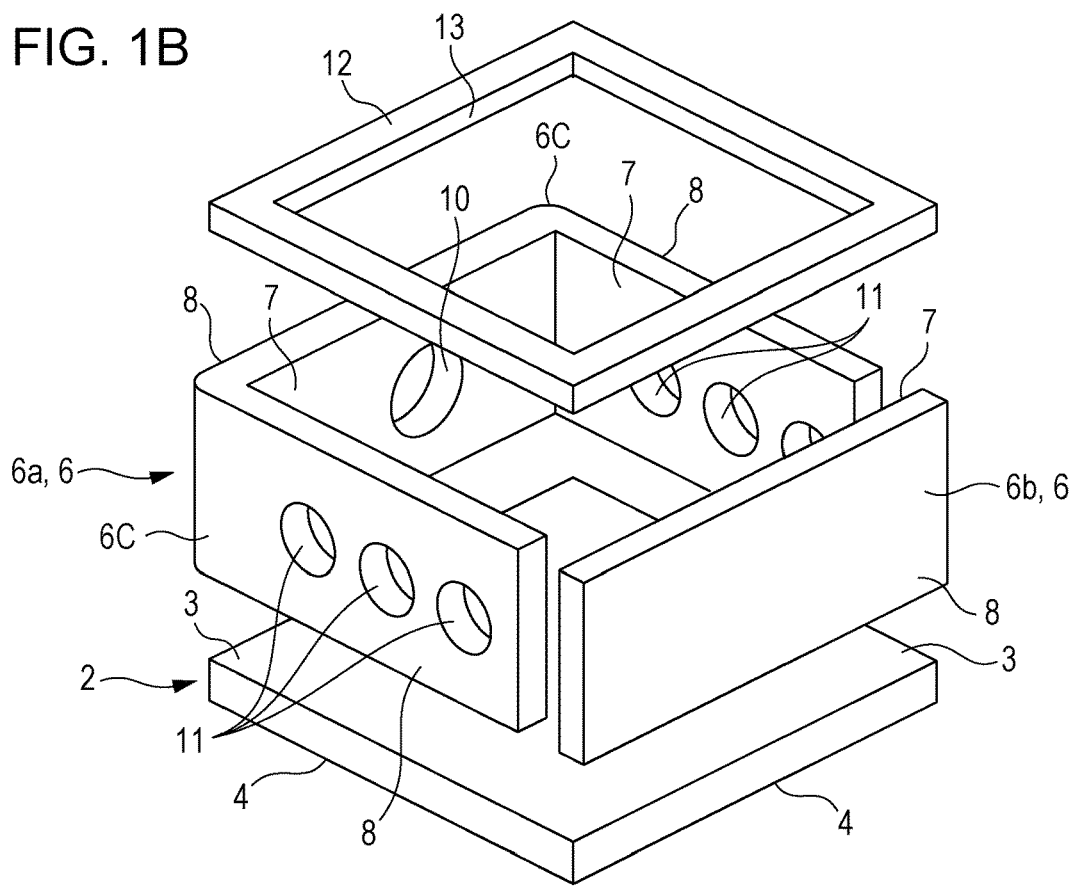
FIG. 1B is an exploded perspective view of the package.

As illustrated in FIGS. 1A and 1B, a package 1a according to an embodiment of the present invention includes a metal substrate 2 that is a flat plate; a metal frame 6 that has a rectangular (square or elongated rectangular) frame shape in plan view and that stands on a front surface 3 of the substrate 2; and a metal ring 12 that has a rectangular frame shape in plan view and disposed on the top end surface of the frame 6. The substrate 2, the frame 6, and the metal ring 12 are made of, for example, Kovar, and define a rectangular-parallelepiped-shaped cavity 9.

The substrate 2 has a rectangular outline in plan view, and includes the front surface 3 and a back surface 4 that oppose each other. A mounting portion (not shown) for a light emitting element is disposed at the front surface 3 side.

The frame 6 is formed by joining metal members 6a and 6b together. In plan view, the metal member 6a is substantially U-shaped (angular U-shaped) and includes two sides that are connected to bent portions provided at both ends of one side and that extend in the same direction that is perpendicular to the one side. The metal member 6b is a flat plate that covers an opening in the metal member 6a. The metal members 6a and 6b each include an inner side surface 7 and an outer side surface 8 that oppose each other. The metal member 6a includes two bent portions 6C.

As illustrated in FIGS. 1A and 1B, among three side walls of the metal member 6a, the side wall at the center has a clearance hole 10 having a relatively large inner diameter, and each of the side walls that oppose each other at both ends of the side wall at the center has three through holes 11 that extend therethrough between the inner side surface 7 and the outer side surface 8. The clearance hole 10 enables a laser beam, for example, emitted from the light emitting element that is mounted afterwards to travel outward, or is used provide connection for an end portion of an optical fiber (not shown). The two sets of three through holes 11, that is, a total of six through holes 11, have lead pins or lead plates extending horizontally therethrough as described below.

The metal ring 12 has a thin rectangular frame shape, and a rectangular opening 13 is formed therein. The shape of the opening 13 is substantially similar to the outline of the metal ring 12 in plan view.

Figure 3A:
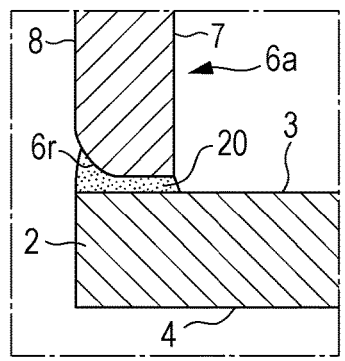
FIG. 3A is an enlarged sectional view of part IIIA surrounded by the one-dot chain line in FIG. 2, and FIGS.

As illustrated in part IIIA surrounded by the one-dot chain line in FIG. 2 and in FIG. 3A, the periphery of the front surface 3 of the substrate 2 and the bottom edge (substrate-side end portion) of the metal member 6a of the frame 6 are joined together by silver solder (joining material) 20.

A curved inclined surface (inclined portion) 6r is formed in advance along the bottom edge of the metal member 6a over the entire length thereof in a region near the outer side surface 8. The inclined surface 6r is inclined toward the center of the metal member 6a (frame) in the thickness direction. Therefore, a larger amount of silver solder 20 is applied over a larger area compared to the case where the inclined surface 6r is not formed on the metal member 6a in the region near the outer side surface 8 in the above-described joining section. As a result, the space between the periphery of the front surface 3 of the substrate 2 and the bottom edge (substrate-side end portion) of the metal member 6a is airtightly sealed by the silver solder 20.

Figure 3B:
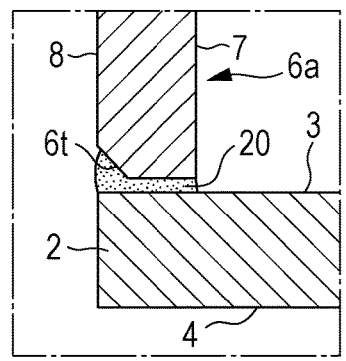

As illustrated in FIG. 3B, instead of the curved inclined surface 6r, a flat inclined surface (inclined portion) 6t may be formed in advance along the bottom edge of the metal member 6a ever the entire length thereof in the region near the outer side surface 8. The flat inclined surface 6t is inclined toward the center of the metal member 6a in the thickness direction.

Figure 3C:
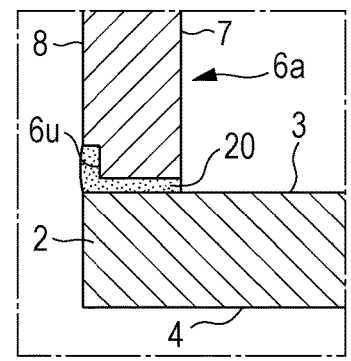

Alternatively, as illustrated in FIG. 3C, a step portion 6u may be formed in advance along the bottom edge of the metal member 6a over the entire length thereof in the region near the outer side surface 8. The step portion 6u has a thickness smaller than a thickness of a central portion of the metal member 6a in the vertical direction.

Similar to the case where the curved inclined surface 6r is formed, the metal member 6a including the flat inclined surface 6t or the step portion 6u can also be airtightly joined. The metal member 6b, which is a flat plate, also has a similar structure.

The curved inclined surface 6r, the flat inclined surface 6t, or the step portion 6u may instead be formed along the bottom edge (substrate-side end portion) of each of the metal members 6a and 6b in a region near the inner side surface 7, or in both of the region near the inner side surface 7 and the region near the outer side surface 8. In this case, the region near the inner side surface 7 and the region near the outer side surface 8 may have different structures; for example, one of the regions may have the inclined surface 6r while the other has the inclined surface 6t.

As illustrated in part IVA surrounded by the one-dot chain line in FIG. 2 and in FIG. 4A, a curved inclined surface 6r similar to that described above is formed along an end portion at the top edge of the metal member 6a of the frame 6, the end portion being at an end opposite to the bottom edge (substrate-side end portion), over the entire length thereof in a region near the outer side surface 8. As illustrated, the end portion at the top edge of the metal member 6a and the metal ring 12 are joined together by the above-described silver solder 20. Also in this joining section, a larger amount of silver spider 20 is applied over a larger area compared to the case where the inclined surface 6r is not provided. As a result, the space between the end portion at the top edge of the metal member 6a and the metal ring 12 is also airtightly sealed by the silver solder 20.

As illustrated in FIG. 4B, instead of the curved inclined surface 6r, a flat inclined surface (inclined portion) 6t may be formed in advance along the top edge of the metal member 6a over the entire length thereof in the region near the outer side surface 8. The flat inclined surface 6t is inclined toward the center of the metal member 6a in the thickness direction.

Alternatively, as illustrated in FIG. 4C, a step portion 6u may be formed in advance along the top edge of the metal member 6a over the entire length thereof in the region near the outer side surface 8. The step portion 6u has a thickness smaller than a thickness of a central portion of the metal member 6a in the vertical direction.

Similar to the case where the curved inclined surface 6r is formed, the metal member 6a including the flat inclined surface 6t or the step portion 6u can also be airtightly joined. The metal member 6b, which is a flat plate, also has a similar structure.

The inclined surface 6r, the inclined surface 6t, or the step portion 6u may instead be formed along the top edge (end portion) of each of the metal members 6a and 6b in a region near the inner side surface 7, or in both of the region near the inner side surface 7 and the region near the outer side surface 8. In this case, the region near the inner side surface 7 and the region near the outer side surface 8 may have different structures; for example, one of the regions may have the inclined surface 6r while the other has the inclined surface 6t.

As illustrated at the left and right in FIG. 2, the two sets of three through holes 11 formed in the pair of opposing side walls of the metal member 6a of the frame 6 each have a lead pin (lead terminal) 18 extending therethrough. The lead pins 18 are inserted through ceramic plates 14 made of, for example, alumina disposed adjacent to the outer side surfaces 8 of the side walls. Each ceramic plate 14 has the shape of a thin rectangular parallelepiped, and has three through holes 15 arranged along the long sides of the ceramic plate 14 and having a diameter smaller than that of the through holes 11. A rectangular-frame-shaped metalized layer 16 made of W or Mo is formed at the periphery of an inner side surface of each ceramic plate 14 that opposes the corresponding outer side surface 8 of the metal member 6a. Three annular metalized layers 17 made of, for example, W are formed on an outer side surface of each ceramic plate 14 so as to individually surround and be spaced from the openings of the three through holes 15.

As illustrated at the left and right in FIG. 2, flange portions 19 that are formed integrally with the lead pins 18 so as to extend radially are individually blazed (joined) to the metalized layers 17 on the outer side surfaces of the ceramic plates 14 with the above-described silver solder 20 provided therebetween. In addition, the ceramic plates 14 are brazed to the outer side surfaces 8 of the metal member 6a with the metalized layers 16 on the inner side surfaces of the ceramic plate 14 and the silver solder 20 provided therebetween. In this state, each of the through holes 11 in the metal member 6a and a corresponding one of the through holes 15 in the ceramic plates 14 are arranged coaxially with each other. As a result, the lead pins 18 continuously extend through the centers of the through holes 11 and 15, and one end of each lead pin 18 extends into the cavity 9 of the package 1a.

As illustrated in FIG. 2, a laser diode (light emitting element) 22 is mounted at the front surface 3 side of the substrate 2 afterwards. The laser diode 22 is to be mounted on a mounting portion (not shown) included in the front surface 3.

Alternatively, the substrate 2 may have a through hole (not shown) having any shape in plan view that extends therethrough between the front surface 3 and the back surface 4, and a radiator (not shown) having a thermal conductivity higher than that of Kovar may be inserted into the through hole from the back surface 4. The laser diode 22 may be mounted on the top surface (mounting portion) of the radiator.

After the laser diode 22 is mounted, a metal cover 23 made of Kovar is joined to the top surface of the metal ring 12 by, for example, resistance welding. The metal ring 12 is joined to the top end surface of the frame 6. As a result, as illustrated in FIG. 2, a light emitting device including the package 1a having the cavity 9 that accommodates the laser diode 22 and that is airtightly sealed from the outside can be obtained.

FIGS. 5A to 5F illustrate a method for manufacturing the metal member 6a included in the frame 6.

As illustrated in FIG. 5A, first, a metal base plate 6x made of Kovar that is prepared in advance is secured on the top surface of a die (not shown). Then, a pair of left and right cutters 21 and a pair of front and back cutters (not shown), that is, a total of four cutters, are inserted into the metal base plate 6x from the top surface to the bottom surface.

As a result, as illustrated in FIG. 5B, a metal base plate 6y having an elongated rectangular shape in plan view and having the above-described curved inclined surfaces 6r along four sides of the top surface is obtained.

Next, a punching process is performed on the metal base plats 6y at predetermined positions by using a punch and a die. As a result, as illustrated in FIG. 5C, a metal base plate 6z having the clearance hole 10 and the two sets of three through holes 11 are obtained. The clearance hole 10 has a relatively large inner diameter and is formed at the center in the long-side direction. The two sets of three through holes 11 are formed symmetrically in the left and right regions.

Then, the metal base plate 6z is bent at predetermined positions between the clearance hole 10 and the two sets of three through holes 11 in the left and right regions by using a bending die (not shown) having a right angle in cross section. As a result, as illustrated in FIGS. 5D and 5F, the metal member 6a that includes the two bent portions 6C at the left and right, that is substantially U-shaped (angular U-shaped) in plan view, and that has the clearance hole 10 and the through holes 11 is obtained.

At this time, as illustrated in FIG. 5E, which is an enlarged view of part VE surrounded by the one-dot chain line in FIG. 5D, a radius of curvature R1 of the outer side surface 8 is greater than a radius of curvature R2 of the inner side surface 7 in each bent portion 6C.

The frame is formed by joining the metal member 6b, which is a flat plate, to the opening in the metal member 6a. Also in the two joining sections between the metal members 6a and 6b, a large amount of silver solder 20 can be applied over a large area due to the curved inclined surfaces 6r on the metal member 6a, as described below.

As illustrated in FIG. 6A, a corner portion 12C of the metal ring 12 and a corner portion 2C of the substrate 2 are disposed adjacent to each bent portion 6C of the metal member 6a of the frame 6 included in the package 1a, and are joined to the bent portion 6C at the top and bottom thereof.

As illustrated in FIG. 6B, a radius of curvature of the corner portion 2C of the substrate 2 and a radius of curvature of the corner portion 12C of the metal ring 12 are smaller than the radius of curvature R1 of the cater side surface 8 of the bent portion 6C. Therefore, the corner portion 2C of the substrate 2 and the corner portion 12C of the metal ring 12 have protruding portions 2h and 12h that protrude outward beyond the curved surface of the bent portion 6C.

Since the above-described protruding portions 2h and 12h are provided, when the metal members 6a (6b) of the frame 6 are joined to the substrate 2 or the metal ring 12 by using the silver solder 20, excess silver solder 20 can be received by the protruding portions 2h and 12h. In addition, a portion of the excess silver solder 20 spreads vertically upward or downward along the bent portion 6C, so that the silver solder 20 can be applied over a larger area.

In the above-described package 1a, the curved inclined surface 6r, the flat inclined surface 6t, or the step portion 6u is formed on the frame 6 in the region near the outer side surface 8 in the joining section between the front surface 3 of the substrate 2 and the end portion at the bottom edge of the frame 6 and the joining section between the end portion at the top edge of frame 6 and the metal ring 12. Therefore, a large amount of silver solder 20 is provided over a large area. The joining sections in which the metal members 6a and 6b of the frame 6 are joined together also have a similar structure.

In addition, the corner portion 2C of the substrate 2 and the corner portion 12C of the metal ring 12, which are disposed adjacent to each bent portion 6C of the frame 6 at the top and bottom thereof, include the protruding portions 2h and 12h, respectively. Therefore, a large amount of silver solder 20 is provided over a large area at the top and bottom ends of each bent portion 6C of the frame 6.

Accordingly, the package 1a reliably provides the above-described effects (1) to (4).

FIG. 7 is a vertical sectional view similar to FIG. 2, illustrating a light emitting device including a package 1b according to another embodiment that is different from the above-described package 1a.

As illustrated in FIG. 7, the package 1b includes a substrate 2, a frame 6 including, for example, the above-described curved inclined surfaces 6r, and a metal ring 12, which are similar to those described above.

The package 1b differs from the package 1a in that two sets of three through holes 11 are formed in the substrate 2 and are arranged in the front-back direction in FIG. 7 along left and right sides of the substrate 2 in FIG. 7. In other words, only the clearance hole 10 is formed in a metal member 6d of the frame 6. Accordingly, as illustrated in FIG. 7, a pair of ceramic plates 14 and six lead pins 18 are arranged on the front surface 3 of the substrate 2 in a manner similar to that in the package 1a.

The pair of ceramic plates 14 and the six lead pins 18 may instead be arranged on the back surface 4 of the substrate 2 axisymmetrically in an arrangement that is vertically inverted from that in FIG. 7.

As illustrated in FIG. 7, also in the package 1b, a laser diode 22 is mounted at the front surface 3 side of the substrate 2 in a manner similar to that described above, and a metal cover 23 is welded to the top surface of the metal ring 12 that is joined to the top end surface of the frame 6 in a manner similar to that described above.

The package 1b also has the above-described effects (1) to (4).

The present invention is not limited to the above-described packages 1a and 1b.

For example, as illustrated in FIG. 8A, the frame 6 may be formed by joining a pair of metal members 6e that are L-shaped in plan view and that each have a single bent portion 6C. The metal members 6e are joined together in two joining sections in which the metal members 6e have the curved inclined surfaces 6r in a manner similar to that described above.

Alternatively, as illustrated in FIG. 8B, the frame 6 may be composed of a single metal member 6f that includes three bent portions 6C and that is formed in a rectangular frame shape in plan view by bending a single metal base plate at three positions. The metal member 6f is joined to itself in a single joining section in a manner similar to that described above.

The metal members 6e and 6f may be structured such that only the clearance hole 10 is formed therein or such that both the clearance hole 10 and the through holes 11 are formed therein.

As illustrated in FIG. 9A, a curved inclined surface 2r similar to the above-described curved inclined surface 6r may be formed along each side of the front surface 3 of the substrate 2. The curved inclined surface 6r is formed along the bottom edge of the metal member 6a of the frame 6, which stands on the front surface 3, in the region near the outer side surface 8. The silver solder 20 may be supplied to a joining section in which the curved inclined surface 2r and the curved inclined surface 6r are arranged symmetrically about a horizontal line.

In this case, a still larger amount of silver solder 20 can be applied over a still larger area in the joining section between the substrate 2 and the frame 6. A flat inclined surface (2t) or a step portion (2u) may be formed on the front surface 3 of the substrate 2 instead of the curved inclined surface 2r.

In addition, as illustrated in FIG. 9B, a curved inclined surface 12r similar to the above-described curved inclined surface 6r may be formed along the outer periphery of the bottom surface of the metal ring 12. The curved inclined surface 6r is formed along the top edge of the metal member 6a of the frame 6 in the region near the outer side surface 8. The silver solder 20 may be supplied to a joining section in which the curved inclined surface 12r and the curved inclined surface 6r are arranged symmetrically about a horizontal line.

In this case, a still larger amount of silver solder 20 can be applied over a still larger area in the joining section between the frame 6 and the metal ring 12.

A flat inclined surface (12t) or a step portion (12u) may be formed on the metal ring 12 instead of the curved inclined surface 12r. The inclined surface 12r, for example, may also be formed on the metal ring 12 in the region near the opening 13.

As illustrated in FIG. 9C, in the joining section between the metal members 6a and 6b that form the frame 6, the curved inclined surface 6r may be formed on the metal member 6a in the region near the outer side surface 8, and a similar inclined surface 6r may also be formed on the metal member 6b in the region near the inner side surface 7. The metal members 6a and 6b may be joined together by applying the silver solder 20 in the joining section.

In this case, a still larger amount of silver solder 20 can be applied over a still larger area in the joining section in which the metal members 6a and 6b are joined together, in which the pair of metal members 6e are joined together, or in which the single metal member 6f is joined to itself to form the frame 6.

The inclined surface 6t or the step portion 6u may be formed instead of the inclined surface 6r.

The substrate 2, the frame 6 and the members thereof such as the metal member 6a, and the metal ring 12 may instead be formed of alloy 42 or alloy 194.

It is not necessary that two sets of three through holes 11, that is, a total of six through holes 11, be formed in the frame 6. For example, a pair of through holes 11 or two sets of two through holes 11, that is, a total of four through holes 11, may instead be provided.

The front surface 3 and the back surface 4 of the substrate 2 may have a polygonal shape having five or more sides in plan view, and the frame may be a polygonal tubular body having an out line similar to the shape of, for example, the front surface 3 of the substrate 2 in plan view.

Alternatively, the front surface 3 and the back surface 4 of the substrate 2 may be circular in plan view, and the frame may have a cylindrical shape.

It is not necessary that the substrate 2 and the metal ring 12 have the protruding portions 2h and 12h.

In addition, the joining material is not limited to the silver solder 20, and may instead be brass solder, gold solder, aluminum solder, or other solders.

The light emitting element may instead be a light emitting diode (LED).

The present invention reliably provides a light-emitting-element mounting package that can be reliably maintained airtight.

What is claimed is:

1. A light-emitting-element mounting package comprising:
    a substrate made of a metal, the substrate including a front surface and a back surface that opposes the front surface, the substrate provided with a mounting portion for a light emitting element at a front surface side of the substrate; and
    a frame made of a metal, the frame standing on the front surface of the substrate and including an inner side surface that surrounds the mounting portion, and an outer side surface,
    wherein a substrate-side end portion of the frame defines an inclined portion or a step portion in at least one of a region near the outer side surface and a region near the inner side surface, the inclined portion being inclined toward a center of the frame in a thickness direction, the step portion having a thickness less than a thickness of a central portion of the frame in a vertical direction, and
    wherein a joining material joins the substrate and the frame together, the joining material disposed between the front surface of the substrate and a part of the substrate-side end portion of the frame that opposes the front surface of the substrate.

2. The light-emitting-element mounting package according to claim 1, wherein the frame includes an opposite end portion opposite to the substrate-side end portion, and a metal ring is disposed on the opposite end portion of the frame extending along an outline of the frame in plan view,
    wherein the opposite end portion defines an inclined portion or a step portion in at least one of a region near the outer side surface and a region near the inner side surface, and
    wherein a joining material joins the frame and the metal ring together, the joining material disposed between the frame and the metal ring.

3. The light-emitting-element mounting package according claim 1, wherein, in plan view, the frame includes at least one joining end portion, and the at least one joining end portion defines an inclined portion or a step portion in at least one of a region near the outer side surface and a region near the inner side surface.

4. The light-emitting-element mounting package according to claim 1, wherein, in plan view, the frame includes at least one bent portion having an outer side surface and an inner side surface, and a radius of curvature of a curved part of the outer side surface of the bent portion is greater than a radius of curvature of a curved part of the inner side surface of the bent portion.

5. The light-emitting-element mounting package according to claim 2, wherein, in plan view, the substrate and a metal ring each have a rectangular outline having four corner portions,
    wherein the frame stands on the substrate so as to extend along the outline of the substrate, and
    wherein the frame includes bent portions disposed at each of the four corner portion of at least one of the substrate and the metal ring, each of the four corner portions including a protruding portion that protrudes outward beyond the respective curved part of the outer side surface of the bent portion of the frame.

* * * * *